United States Patent
Lin

(10) Patent No.: US 8,368,150 B2
(45) Date of Patent: Feb. 5, 2013

(54) HIGH PERFORMANCE IC CHIP HAVING DISCRETE DECOUPLING CAPACITORS ATTACHED TO ITS IC SURFACE

(75) Inventor: Mou-Shiung Lin, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 242 days.

(21) Appl. No.: 10/802,566

(22) Filed: Mar. 17, 2004

(65) Prior Publication Data

US 2004/0183209 A1    Sep. 23, 2004

Related U.S. Application Data

(60) Provisional application No. 60/455,154, filed on Mar. 17, 2003.

(51) Int. Cl.
*H01L 27/11* (2006.01)
(52) U.S. Cl. . 257/379; 257/516; 257/528; 257/E27.113; 438/210; 438/329
(58) Field of Classification Search .................. 257/532, 257/535, 723, 685, 686, 379; 438/666
See application file for complete search history.

(56) References Cited

U.S. PATENT DOCUMENTS

| | | | |
|---|---|---|---|
| 4,021,838 A | 5/1977 | Warwick | |
| 4,685,998 A | 8/1987 | Quinn et al. | |
| 5,095,402 A | 3/1992 | Hernandez et al. | |
| 5,226,232 A | 7/1993 | Boyd | |
| 5,346,858 A * | 9/1994 | Thomas et al. | 438/669 |
| 5,519,582 A | 5/1996 | Matsuzaki | |
| 5,608,262 A | 3/1997 | Degani et al. | |
| 5,629,240 A | 5/1997 | Malladi et al. | |
| 5,742,100 A | 4/1998 | Schroeder et al. | |
| 6,020,640 A * | 2/2000 | Efland et al. | 257/751 |
| 6,184,574 B1 | 2/2001 | Bissey | 257/666 |
| 6,267,290 B1 * | 7/2001 | Murdeshwar | 228/180.5 |
| 6,303,423 B1 * | 10/2001 | Lin | 438/238 |
| 6,383,916 B1 | 5/2002 | Lin | 438/637 |
| 6,451,681 B1 * | 9/2002 | Greer | 438/601 |
| 6,461,895 B1 * | 10/2002 | Liang et al. | 438/107 |
| 6,495,442 B1 | 12/2002 | Lin et al. | 438/618 |
| 6,504,236 B2 | 1/2003 | Bissey | 257/666 |
| 6,515,369 B1 | 2/2003 | Lin | 257/773 |
| 6,756,664 B2 | 6/2004 | Yang | |
| 6,869,870 B2 | 3/2005 | Lin | |
| 6,921,980 B2 * | 7/2005 | Nakanishi et al. | 257/784 |
| 2002/0008967 A1 * | 1/2002 | Feustel et al. | 361/767 |
| 2003/0037959 A1 * | 2/2003 | Master et al. | 174/256 |

(Continued)

FOREIGN PATENT DOCUMENTS

| | | |
|---|---|---|
| TW | 444298 | 7/2001 |
| TW | 506045 | 10/2002 |

(Continued)

OTHER PUBLICATIONS

Co-pending U.S. Appl. No. 10/855,086, filed May 27, 2004, assigned to the same assignee.

(Continued)

*Primary Examiner* — Ajay K Arora
(74) *Attorney, Agent, or Firm* — McDermott Will & Emery LLP

(57) ABSTRACT

In the present invention, discrete decoupling capacitors are mounted on the surface of an IC chip. Since a discrete capacitor can provide the capacitance of the magnitude μF, the attached capacitors can serve as the local power reservoir to decouple the external power ground noise caused by wirebonds, packages, and other system components.

38 Claims, 5 Drawing Sheets

U.S. PATENT DOCUMENTS

| | | | |
|---|---|---|---|
| 2003/0043558 A1* | 3/2003 | Shirasaki | 361/767 |
| 2003/0080092 A1* | 5/2003 | Arvin et al. | 216/83 |
| 2003/0111709 A1* | 6/2003 | Lin et al. | 257/532 |
| 2003/0119299 A1* | 6/2003 | Jiang et al. | 438/612 |

FOREIGN PATENT DOCUMENTS

| | | |
|---|---|---|
| TW | 511243 | 11/2002 |
| TW | 525291 | 3/2003 |

OTHER PUBLICATIONS

Office Action for Taiwan Patent Application No. 092107480 dated Oct. 8, 2009 w/English Translation.

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

HIGH PERFORMANCE IC CHIP HAVING DISCRETE DECOUPLING CAPACITORS ATTACHED TO ITS IC SURFACE This application claims priority to U.S. Provisional Patent Application Ser. No. 60/455,154, filed on Mar. 17, 2003, which is herein incorporated by reference.

RELATED PATENT APPLICATION

Related U.S. patent application Ser. No. 10/855,086, to Wafer level processing method and structure to manufacture two kinds of bumps, gold and solder, on one wafer, filed on May 27, 2004.

BACKGROUND OF THE INVENTION

1. Field of the Invention

This invention relates to structures and methods of assembly of integrated circuit chips. More particularly, this invention relates to mounting discrete decoupling capacitors on the surface of IC chips.

2. Description of the Related Art

Current wirebonding packages, for example, ball grid arrays (BGA), suffer from power/ground noise due to the inductance of wirebonds and package leads. This issue becomes severe in advanced chips performing at high frequency and low voltage. Flip chip packages are now used to reduce the inductance from wirebonds. However, the industry infrastructure for flip chip packages is not so mature as wirebonding packaging. Most importantly, flip chip packages require high density substrates which are much more expensive than wirebonding substrates. Wirebonds act as the fan-out metal lines; therefore the routing density on substrates is relaxed. Other approaches attempt to solve the power/ground problem by building on-chip decoupling capacitors using thin-film IC processes for the wirebonding packages. However, the built-in capacitors cannot provide large enough magnitude capacitance for decoupling purposes.

U.S. Pat. Nos. 6,303,423 and 6,515,369, both by M. S. Lin, teach methods and structures of mounting a discrete component on the surface of an IC chip. Related patent application Ser. No. 10/855,086 discloses methods of making both solder bumps and wirebond pads on the same wafer. U.S. Pat. Nos. 6,495,442 and 6,383,916 to M. S. Lin et al disclose a post-passivation interconnection process. U.S. Pat. Nos. 6,184,574 and 6,504,236 both to Bissey disclose an integrated circuit lead frame with capacitors formed on the lead frame and bonded to the bottom surface of the chip for decoupling purposes.

SUMMARY OF THE INVENTION

An object of this invention is to provide discrete decoupling capacitors mounted on the surface of an IC chip.

Another object of this invention is to provide a method for mounting discrete decoupling capacitors on the surface of an IC chip.

A further object is to provide a wirebonding package for high performance and low power IC chips by adding surface mounted decoupling capacitors.

A still further object is to attach surface mounted decoupling capacitors to wirebonds through IC metal lines under passivation.

Another object is to attach surface mounted decoupling capacitors to wirebonds through post-passivation metal lines above the passivation layer.

Yet another object of the invention is to connect surface mounted decoupling capacitors to power/ground buses under the passivation layer.

In accordance with the objects of the invention, a high performance integrated circuit chip is disclosed comprising semiconductor device structures in and on a substrate, a plurality of levels of interconnection lines and interlevel dielectric materials overlying and connecting the semiconductor device structures wherein at least one contact pad is interconnected, a passivation layer overlying the plurality of levels of interconnection lines and interlevel dielectric materials, wirebonds formed overlying the passivation layer and connected to at least one contact pad, and at least one discrete decoupling capacitor mounted on a solder wettable surface over the passivation layer wherein the discrete decoupling capacitor is connected to wirebonds and to power/ground buses.

Also in accordance with the objects of the invention, a method of fabricating a high performance integrated circuit chip is achieved. Semiconductor device structures are formed in and on a substrate. A plurality of levels of interconnection lines and interlevel dielectric materials are formed overlying and connecting the semiconductor device structures wherein a topmost level of the interconnection lines includes at least one contact pad. A passivation layer is deposited overlying the plurality of levels of interconnection lines and interlevel dielectric materials. Vias are opened through the passivation layer to the contact pad. Metal lines are formed in the vias and overlying the passivation layer. Wirebonds are formed on the metal lines. Solder pads are formed on the metal lines adjacent to the wirebonds. At least one discrete decoupling capacitor is mounted on the solder pads wherein the discrete decoupling capacitor is connected to wirebonds and to power/ground buses.

Also in accordance with the objects of the invention, a method of fabricating a high performance integrated circuit chip is achieved. Semiconductor device structures are formed in and on a substrate. A plurality of levels of interconnection lines and interlevel dielectric materials are formed overlying and connecting the semiconductor device structures wherein a topmost level of the interconnection lines includes at least one contact pad. A passivation layer is deposited overlying the plurality of levels of interconnection lines and interlevel dielectric materials. At least one discrete decoupling capacitor is mounted on the solder pads wherein the discrete decoupling capacitor is connected to wirebonds and to power/ground buses.

DETAILED DESCRIPTION OF THE INVENTION

In the present invention, discrete decoupling capacitors are mounted on the surface of an IC chip. Since a discrete capacitor can provide the capacitance of the magnitude μF, the attached capacitors can serve as the local power reservoir to decouple the external power ground noise caused by wirebonds, packages, and other system components. It will be understood by those skilled in the art that the present invention should not be limited to any of the examples shown, but can be extended and applied to any kind of IC chip design.

Figure 1:
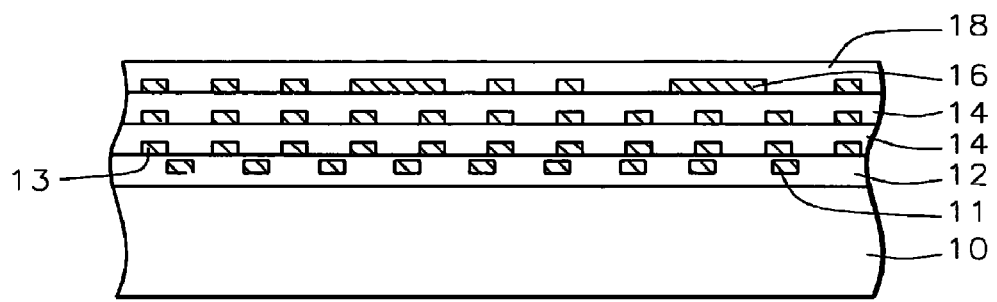
FIG. 1 shows a cross-sectional view of a preferred embodiment of the present invention.

Referring now to FIG. 1, there is shown an example of a preferred embodiment of the present invention. Semiconductor substrate 10 is shown. Transistors and other devices, not shown, are formed in and on the semiconductor substrate 10. Dielectric layer 12 is formed over the substrate 10. Conductive interconnect lines 11 are formed within the dielectric layer connecting to devices formed in and on the substrate, not shown. Layers 14 represent the plurality of metal and dielectric layers formed in a typical integrated circuit. Two layers 14 are shown in FIG. 1, including metal interconnects 13. Multiple layers of dielectric materials may be included in layers 14. More than two layers 14 may be present. Overlying these layers 14 are points of contact 16 that will be connected to surrounding circuitry. Passivation layer 18 is formed over the contacts 16. The contacts 16 may be an aluminum pad. The passivation layer may comprise silicon oxide or silicon nitride or a composite of these materials. The passivation layer prevents the penetration of mobile ions, such as sodium ions, moisture, transition metals, such as gold, silver, copper, and so on, and other contaminations. The passivation layer is used to protect the underlying devices, such as transistors, polysilicon resistors, poly-to-poly capacitors, and fine-line metal interconnections. Now, connection is to be made to the next level of packaging. Wirebonding is to be used in the connection. Discrete decoupling capacitors are mounted on the surface of the IC chip. In one preferred embodiment of the invention, the decoupling capacitors are connected to the wirebond through IC metal lines under the passivation layer. Discrete capacitors provide optimized parameters and can be mounted close to the circuits, which offer system-on-chip performance and minimizes parasitics. The post-passivation process of the present invention allows for the selection of discrete capacitor design parameters that result in reduced resistance of the discrete capacitor.

Figure 2:
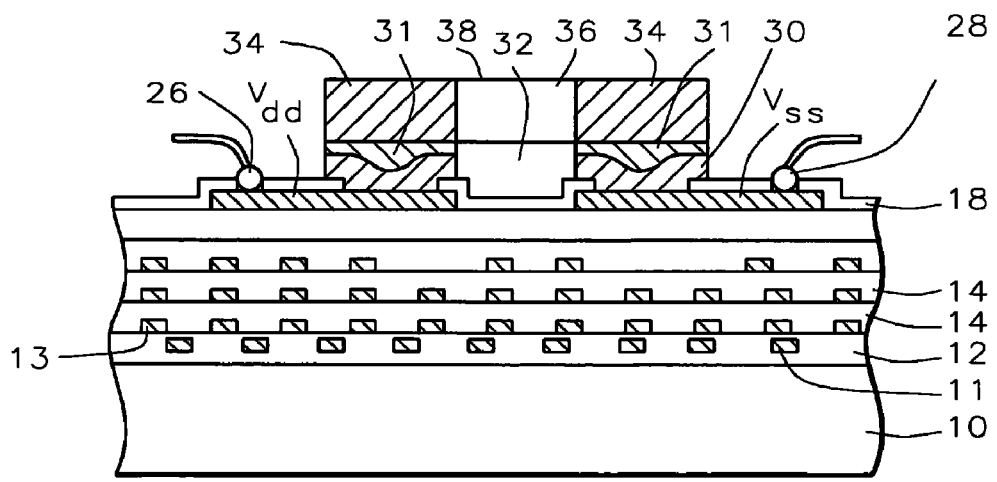
FIG. 2 shows a cross-sectional view of a first preferred embodiment of the present invention in which the decoupling capacitors are connected to metal lines underlying the passivation layer.

Referring now to FIG. 2, there is shown the first preferred embodiment of the invention. A typical discrete decoupling capacitor 38 is shown. This commercially available discrete capacitor has already been coated with solder, not shown, at both ends, terminals or electrodes 34.

In the first preferred embodiment of the invention, the decoupling capacitors are connected to the wirebond through IC metal lines under the passivation layer 18. Wirebonds 26 and 28 are shown. The wirebonds are bonded to metal segments Vdd and Vss in the top layer of metal underlying passivation layer 18. To facilitate the reader's review of the process, the wires have been arranged in a specific manner in the figures. The wirebond on the left 26 is connected to Vdd and the wirebond on the right 28 is connected to Vss. It will be understood that this specific manner of connection is not essential and may be changed without departing from the spirit and scope of the invention.

Decoupling capacitor 38 is also connected to the same metal segments Vdd and Vss, as shown.

Solder pads 30 are formed to connect the capacitor electrodes 34 to the metal segments Vdd and Vss. The capacitor 38 serves as a local power reservoir to decouple the external power ground noise caused by the wirebonds 26 and 28 and other system components. A decoupling capacitor is connected in association with each of at least two wirebonds.

The capacitors are mounted on the silicon wafers, for example, using standard Surface Mount Technology (SMT) as in the Printed Circuit Board industry. The commercially available discrete capacitors have been already coated with solder at both ends (terminals or electrodes). Therefore, on the IC wafer, the solder pads 30 are prepared with a solder wettable surface. For example, solder cream can be printed on the IC pads. Solder 31 is shown in FIG. 2 on the solder pads 30.

Alternatively, surface mountable pads may be created. The surfaces of the solder pads 30 are finished with a solder wettable material such as solder, gold, or copper by electroplating, electroless plating, or sputtering. Furthermore, a diffusion barrier metal, not shown, is required under the solder wettable metal to prevent intermetal diffusion between the solder and the pad metal.

The capacitor 38 is surface-mounted on the chip, as shown, and serves as a buffer between the underlying electrical devices and the outside circuit. Thus, the capacitor has a decoupling function when acting as a power reservoir, so that when one of the underlying semiconductor devices suddenly requires a relatively large electric current, the capacitor 38 can immediately supply power to the device. Moreover, the capacitor 38 can be provided with a high electrical capacity so that a sudden voltage drop between the power bus and the ground bus can be prevented. Furthermore, when a relatively large electrical charge flows into the chip, the capacitor 38 acts as a buffer to prevent damage to underlying semiconductor devices. Alternately, the capacitor can be used to isolate an attached circuit from ground noise.

Figure 3:
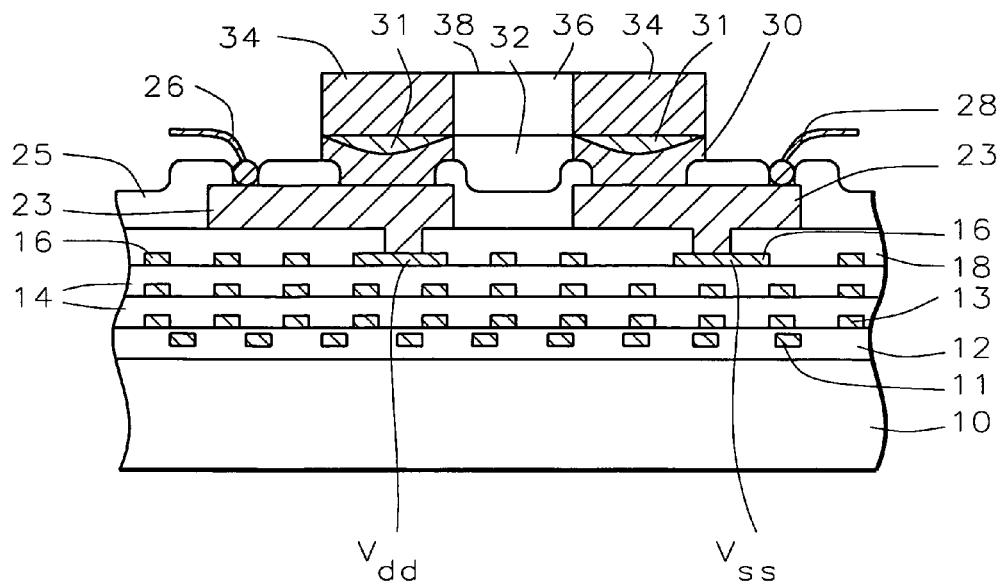
FIG. 3 shows a cross-sectional view of a second preferred embodiment of the present invention in which the decoupling capacitors are connected to post-passivation metal above the passivation layer.

In a second preferred embodiment of the invention, the decoupling capacitors are connected to the wirebond through post passivation metal lines above the passivation layer. Referring now to FIG. 3, there is shown an example of the second preferred embodiment of the invention.

The device and metal interconnect layers are as shown in FIGS. 1-2. The topmost metal layer is 16. Passivation layer 18 has been formed over this metal layer, as described above. The passivation layer prevents the penetration of mobile ions, such as sodium ions, moisture, transition metals, such as gold, silver, copper, and so on, and other contaminations. The passivation layer is used to protect the underlying devices, such as transistors, polysilicon resistors, poly-to-poly capacitors, and fine-line metal interconnections.

Now, the post-passivation metallization, formed of, for example, copper or gold, is to be formed. The post-passivation metallization is described in co-pending U.S. patent application Ser. No. 10/445,560, filed May 27, 2003, and herein incorporated by reference. Openings are made through the passivation layer 18 to form thick metal lines 23.

A post-passivation dielectric layer 25 is deposited over the thick metal lines 23. Preferably, this layer 25 is polyimide having a thickness of between about 2 and 150 microns, depending on electrical design requirements. Alternatively, the layer 25 could be made of benzocyclobutene (BCB), a porous dielectric material, parylene, or an elastomer, for example.

Now, openings are made to the thick metal lines 23 for wirebonds 26 and 28. Openings are made through the post-passivation dielectric layer 25 to the metal lines 23 for connecting the decoupling capacitor 38. Connection is as described above in the first embodiment.

Wirebonds may be made directly to the post passivation metallization 23 if a thick layer of gold (greater than about 1 micron) is used for the metallization. An underbump metallization (UBM) layer is required for solder bumping to gold less than 1 micron thick, or to copper. If a wirebond is to be made to copper, a layer of nickel, then a layer of gold are formed over the copper.

Figure 4A:
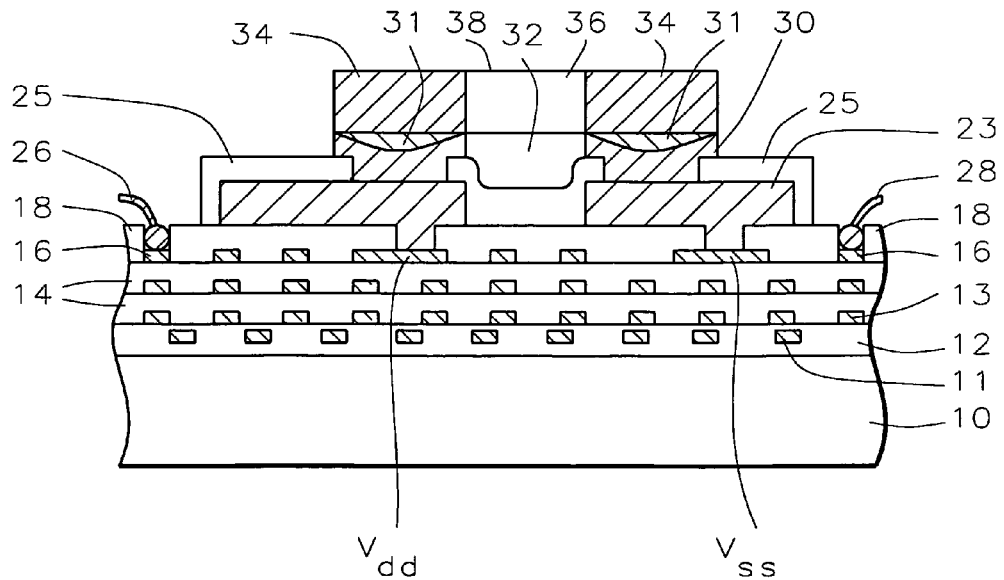
FIG. 4A shows a cross-sectional view of a first alternative to the second preferred embodiment of the present invention in which the wirebonds are connected to the underlying fine-line metal line.
Figure 4B:
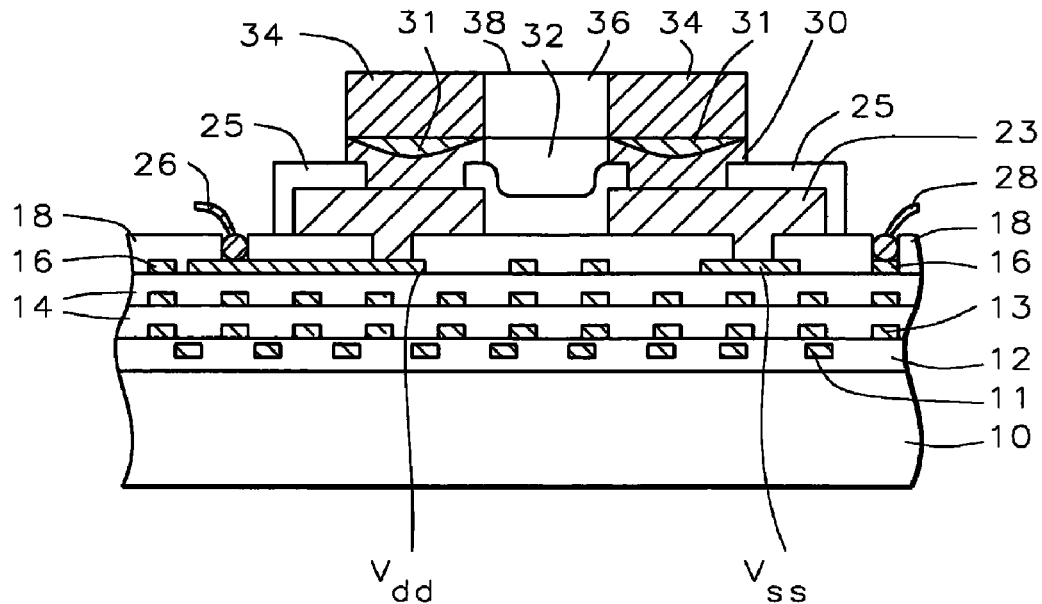
FIG. 4B shows a cross-sectional view of a second alternative to the second preferred embodiment of the present invention in which the wirebonds are connected to the decoupling capacitors through the underlying fine-line metal line.

In FIG. 4A, the thick metal layer 23 and post-passivation dielectric layer 25 have been patterned to underlie the capacitor area. Wirebonds 26 and 28 are formed to the metal line 16 rather than to the thick metal lines 23. In FIG. 4B, the decoupling capacitor 38 is connected to the wirebonds 26 and 28 through the metal line 16.

Figure 5:
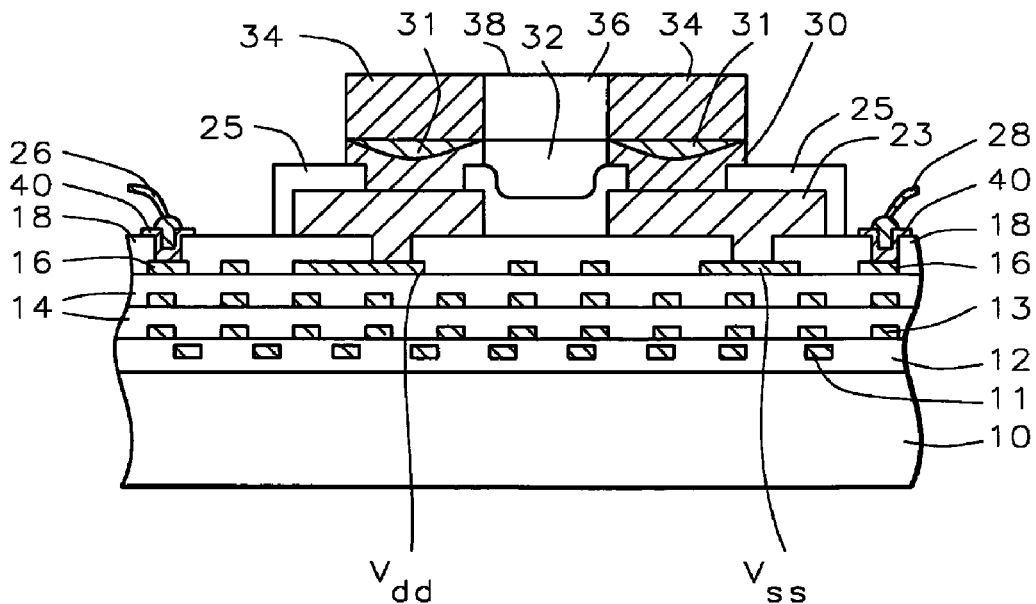
FIGS. 5 through 8 show cross-sectional views of additional alternatives in the second preferred embodiment of the present invention.

In FIG. 5, for example, gold pads 40 are formed through openings in the passivation layer 18 to the metal lines 16 under the passivation layer. The gold pads 40 may be on the aluminum pad 16 exposed by an opening in the passivation layer 18. The wirebonds 26 and 28 are connected to the gold pads.

The decoupling capacitor 38 is mounted on the surface of the IC chip. Solder pads must be created for the mounting process. Co-pending U.S. patent application Ser. No. 10/855,086 describes a process for forming both gold wirebond pads and solder pads on the same wafer.

Figure 6:
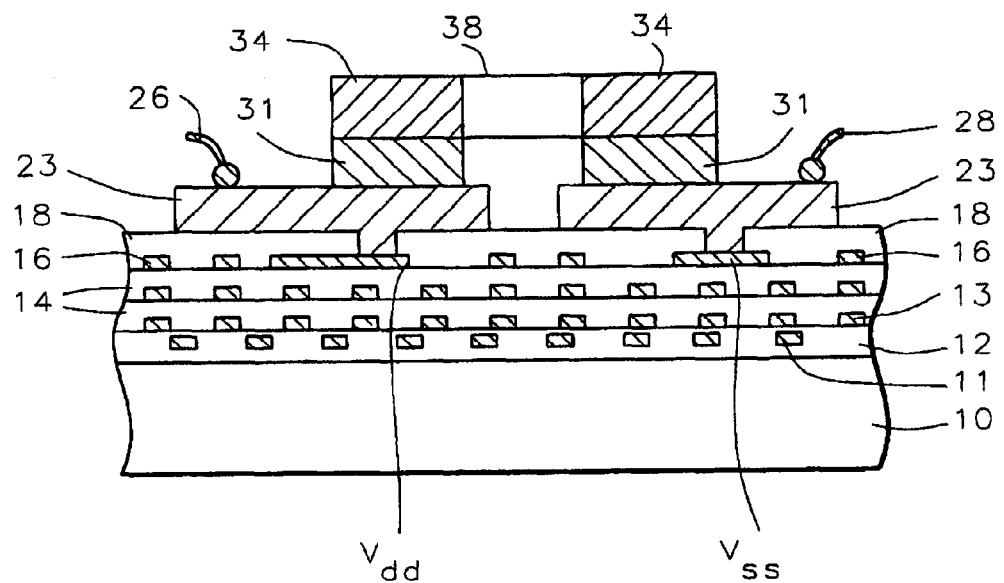

In an alternative illustrated in FIG. 6, the wirebonds 26 and 28 are made directly to the metal line 23 without an intervening post-passivation dielectric layer. The capacitor 38 is also mounted directly on the metal line 23 by solder 31. A solder bonding metal, not shown, can be provided between the solder 31 and the metal lines 23.

Figure 7:
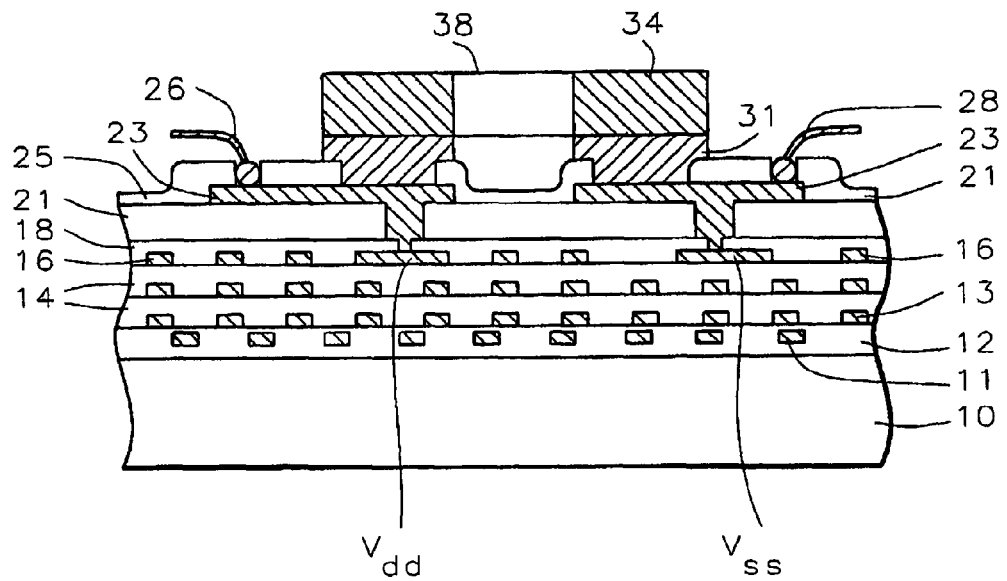

In a third preferred embodiment of the present invention, a thick post-passivation dielectric layer is formed underlying the thick metal lines. As shown in FIG. 7, a thick post-passivation dielectric layer 21, such as polyimide, is deposited over the passivation layer 18. Openings 70 are made through the post-passivation dielectric layer 21 and the passivation layer 18 to the metal lines 16. Thick metal lines 23 are formed to contact the metal lines 16.

Now, a second thick post-passivation dielectric layer 25, such as polyimide, is deposited over the thick metal lines 23. Now, openings are made in the second post-passivation dielectric layer 25 to the thick metal lines 23. Wirebonds 26 and 28 are made within these openings. Similarly, openings are made to the thick metal lines 23. The capacitor 38 is connected to the metal lines 23 with solder 31.

Figure 8:
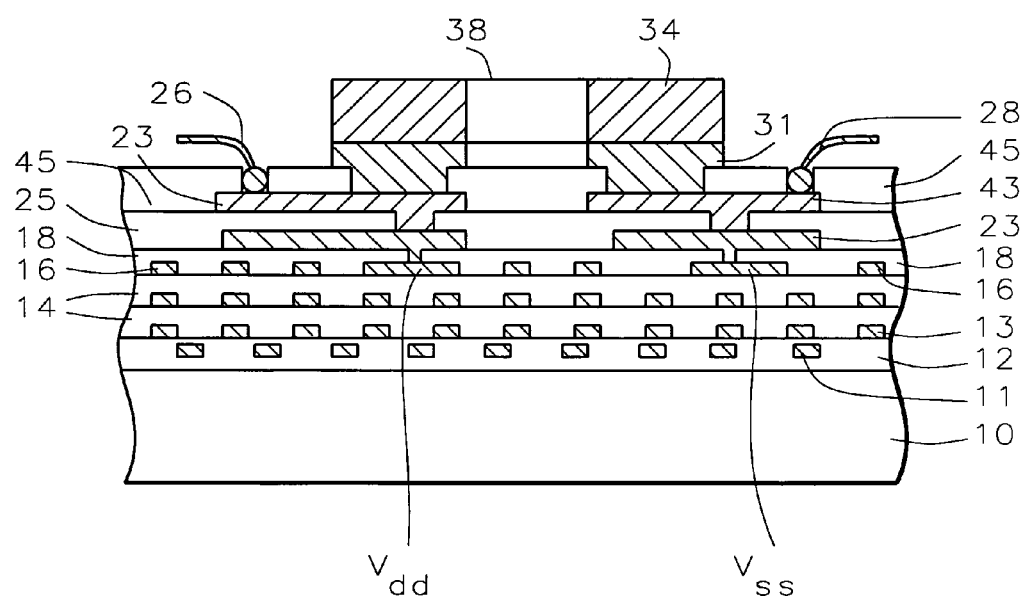

FIG. 8 illustrates a further alternative in which two layers of thick metal lines are formed in a post-passivation process. The first thick metal lines 23 are formed overlying the passivation layer 18 and connected to the interconnection lines 16 through openings in the passivation layer 18. A first post-passivation dielectric layer 25 is deposited overlying the first thick metal lines. Second thick metal lines 43 are formed overlying the first post-passivation dielectric layer and connected to the first thick metal lines through openings in the first post-passivation dielectric layer. A second post-passivation dielectric layer 45 is deposited over the second thick metal lines. Wirebonds 26 and 28 are formed through openings in the second post-passivation dielectric layer 45 to the second thick metal lines 43. Decoupling capacitor 38 is connected to the interconnection lines 16 through openings in the second post-passivation dielectric layer 45 to the second thick metal lines 43.

While this invention has been particularly shown and described with reference to the preferred embodiments thereof, it will be understood by those skilled in the art that various changes in form and details may be made without departing from the spirit and scope of the invention.

What is claimed is:

1. An integrated circuit device comprising:
a semiconductor substrate comprising a base surface and an active surface vertically spaced apart from and opposing said base surface, said active surface extending in a horizontal direction and having at least one active device therein;
multiple metal and dielectric layers over said semiconductor substrate;
a first contact pad over said active surface of said semiconductor substrate;
a second contact pad over said active surface of said semiconductor substrate;
a passivation layer over said multiple metal and dielectric layers, wherein said passivation layer comprises a nitride, wherein a first opening in said passivation layer is over a first contact area of said first contact pad, and said first contact area is at a bottom of said first opening, and wherein a second opening in said passivation layer is over a second contact area of said second contact pad, and said second contact area is at a bottom of said second opening;
a power metal pad over said passivation layer and covered by a post-passivation layer comprising a polymer, said power metal pad having a first region and a second region, said second region being directly vertically over said first contact area, wherein said power metal pad is connected to said first contact area through said first opening, and said first region is not directly vertically over, and is horizontally offset from, said first opening and said first contact area such that said first region is directly attached to a wirebond through an opening in said post-passivation layer for connection made to a next level of packaging;
a ground metal pad over said passivation layer and covered by said post-passivation layer, said ground metal pad having a third region and a fourth region, said fourth region being directly vertically over said second contact area, wherein said ground metal pad is connected to said second contact area through said second opening, and the third region is not directly vertically over, and is horizontally offset from, said second opening and said second contact area such that said third region is directly attached to a wirebond through an opening in the post-passivation layer for connection made to said next level of packaging;
a capacitor over said post-passivation layer and said power and ground metal pads, said capacitor comprising a first terminal and a second terminal, said first terminal directly vertically over and connected through an opening in said post-passivation layer by a first solder joint to said second region, and said second terminal directly vertically over and connected through an opening in said post-passivation layer by a second solder joint to said fourth region.

2. The integrated circuit device according to claim 1, wherein said ground metal pad further comprises a copper layer and a gold layer over said copper layer.

3. The integrated circuit device according to claim 1, wherein said nitride comprises silicon nitride.

4. The integrated circuit device according to claim 1, wherein said ground metal pad further comprises a copper layer and a nickel layer over said copper layer.

5. The integrated circuit device according to claim 1, wherein said passivation layer further comprises an oxide.

6. The integrated circuit device according to claim 1, wherein said passivation layer further comprises silicon oxide.

7. An integrated circuit device comprising:
- a semiconductor substrate comprising a base surface and an active surface vertically spaced apart from and opposing said base surface, said active surface extending in a horizontal direction and having at least one active device therein;
- multiple metal and dielectric layers over said semiconductor substrate;
- a first contact pad over said active surface of said semiconductor substrate;
- a passivation layer over said multiple metal and dielectric layers, wherein a first opening in said passivation layer is over a first contact area of said first contact pad, and said first contact area is at a bottom of said first opening, wherein said passivation layer comprises a nitride;
- a second contact pad over said active surface of said semiconductor substrate, over said passivation layer and covered by a post-passivation layer comprising a polymer, said second contact pad having a first region and a second region, said second region being directly vertically over said first opening and said first contact area, said second contact pad being connected to said first contact area through said first opening, wherein said second contact pad comprises a first gold layer with a thickness greater than 1 micrometer, and wherein said first region is not directly vertically over, and is horizontally offset from, said first opening and said first contact area such that said first region is directly attached to a wirebond through an opening in said post-passivation layer;
- a capacitor over said post-passivation layer and said second contact pad, said capacitor comprising a first terminal that is directly vertically over and connected through an opening in said post-passivation layer by a first solder joint to said second region of said second contact pad, thereby being electrically coupled to said first contact area.

8. The integrated circuit device according to claim 7 further comprising a third contact pad over said semiconductor substrate, wherein a second opening in said passivation layer is over a second contact area of said third contact pad, and said second contact area is at a bottom of said second opening, wherein said second contact area is configured to be wirebonded thereto for connection made to a next level of packaging.

9. The integrated circuit device according to claim 7 further comprising a third contact pad over said passivation layer, wherein said third contact pad is configured to be wirebonded thereto for connection made to a next level of packaging.

10. The integrated circuit device according to claim 9, wherein said third contact pad comprises a second gold layer.

11. The integrated circuit device according to claim 7 further comprising a third contact pad over said semiconductor substrate, wherein a second opening in said passivation layer is over a second contact area of said third contact pad, and said second contact area is at a bottom of said second opening, and a fourth contact pad on said second contact area, wherein said fourth contact pad is configured to be wirebonded thereto for connection made to a next level of packaging.

12. The integrated circuit device according to claim 7, wherein said capacitor comprises a decoupling capacitor.

13. The integrated circuit device according to claim 7, wherein said nitride comprises silicon nitride.

14. The integrated circuit device according to claim 7, wherein said passivation layer further comprises an oxide.

15. The integrated circuit device according to claim 7, wherein said passivation layer further comprises silicon oxide.

16. An integrated circuit device comprising:
- a semiconductor substrate comprising a base surface and an active surface vertically spaced apart from and opposing said base surface, said active surface extending in a horizontal direction and having at least one active device therein;
- multiple metal and dielectric layers over said semiconductor substrate;
- a first contact pad over said active surface of said semiconductor substrate;
- a passivation layer over said multiple metal and dielectric layers, wherein said passivation layer comprises a nitride, wherein a first opening in said passivation layer is over a first contact area of said first contact pad, and said first contact area is at a bottom of said first opening;
- a second contact pad over said active surface of said semiconductor substrate, over said passivation layer and covered by a post-passivation layer comprising a polymer, said second contact pad having a first region and a second region, said second region being directly vertically over said first contact area, wherein said second contact pad is connected to said first contact area through said first opening, wherein a second opening in said post-passivation layer is over a second contact area of said second contact pad, and said second contact area is at a bottom of said second opening, and said first region is not directly vertically over, and is horizontally offset from, said first opening and said first contact area such that said first region is directly attached to a wirebond through an opening in said post-passivation layer for connection made to a next level of packaging;
- a third contact pad over said active surface of said semiconductor substrate, over said passivation layer and covered by said post-passivation layer, said third contact pad having a third region and a fourth region, said fourth region being directly vertically over said second contact area, wherein said third contact pad is connected to said second contact area through said second opening, and said third region is not directly over, and is horizontally offset from, said second opening and said second contact area such that said third region is directly attached to a wirebond through an opening in said post-passivation layer for connection made to said next level of packaging;
- a capacitor over said post-passivation layer, said capacitor having a terminal that is directly vertically over and connected through a second opening in said post-passivation layer to said second contact area; and
- a solder joint between said second contact area and said terminal of said capacitor, wherein said solder joint connects said terminal to said second contact area.

17. The integrated circuit device according to claim 16, wherein said second contact pad comprises a gold layer.

18. The integrated circuit device according to claim 16, wherein said second contact pad comprises a copper layer.

19. The integrated circuit device according to claim 16, wherein a ground voltage is applied to said first contact pad.

20. The integrated circuit device according to claim 16, wherein a power supply voltage is applied to said first contact pad.

21. The integrated circuit device according to claim 16, wherein said nitride comprises silicon nitride.

22. The integrated circuit device according to claim 16, wherein said third contact pad comprises a gold layer.

23. The integrated circuit device according to claim 16, wherein said capacitor comprises a decoupling capacitor.

24. The integrated circuit device according to claim 16, wherein said post-passivation layer comprises polyimide.

25. The integrated circuit device according to claim 16, wherein said post-passivation layer has a thickness between 2 and 150 micrometers.

26. The integrated circuit device according to claim 16, wherein a ground voltage is applied to said first, second and third contact pads.

27. The integrated circuit device according to claim 16, wherein a power supply voltage is applied to said first, second and third contact pads.

28. The integrated circuit device according to claim 16, wherein said passivation layer further comprises an oxide.

29. The integrated circuit device according to claim 16, wherein said passivation layer further comprises silicon oxide.

30. An integrated circuit device comprising:
   a semiconductor substrate comprising a base surface and an active surface vertically spaced apart from and opposing said base surface, said active surface extending in a horizontal direction and having at least one active device therein;
   multiple metal and dielectric layers over said semiconductor substrate;
   a first contact pad over said active surface of said semiconductor substrate;
   a passivation layer over said multiple metal and dielectric layers, wherein a first opening in said passivation layer is over a first contact area of said first contact pad, and said first contact area is at a bottom of said first opening, wherein said passivation layer comprises a nitride;
   a second contact pad over said active surface of said semiconductor substrate, over said passivation layer and covered by a post-passivation layer comprising a polymer, said second contact pad having a first region and a second region, said second region being directly vertically over said first opening and said first contact area, said second contact pad being connected to said first contact area through said first opening, wherein said second contact pad comprises a first gold layer with a thickness greater than 1 micrometer, and wherein said first region is not directly vertically over, and is horizontally offset from, said first opening and said first contact area such that said first region is directly attached to a wirebond through an opening in said post-passivation layer for connection made to a next level of packaging;
   a capacitor over said post-passivation layer and said second contact pad, said capacitor comprising a first terminal that is directly vertically over and connected through an opening in said post-passivation layer by a first solder joint to said second region of said second contact pad, thereby being electrically coupled to said first contact area; and
   a third contact pad between said first solder joint and said second contact pad, wherein said third contact pad is finished with a solder wettable material comprising gold, wherein a contact area between said third contact pad and said second contact pad is not directly vertically over said first contact area.

31. The integrated circuit device according to claim 30 further comprising a fourth contact pad over said semiconductor substrate, wherein a second opening in said passivation layer is over a second contact area of said fourth contact pad, and said second contact area is at a bottom of said second opening, wherein said second contact area is configured to be wirebonded thereto for connection made to a next level of packaging.

32. The integrated circuit device according to claim 30 further comprising a fourth contact pad over said passivation layer, wherein said fourth contact pad is configured to be wirebonded thereto for connection made to a next level of packaging.

33. The integrated circuit device according to claim 30 further comprising a fourth contact pad over said semiconductor substrate, wherein a second opening in said passivation layer is over a second contact area of said fourth contact pad, and said second contact area is at a bottom of said second opening, and a fifth contact pad on said second contact area, wherein said fifth contact pad is configured to be wirebonded thereto for connection made to a next level of packaging.

34. The integrated circuit device according to claim 33, wherein said fifth contact pad comprises a second gold layer.

35. The integrated circuit device according to claim 30, wherein said capacitor comprises a decoupling capacitor.

36. The integrated circuit device according to claim 30, wherein said nitride comprises silicon nitride.

37. The integrated circuit device according to claim 30, wherein said passivation layer further comprises an oxide.

38. The integrated circuit device chip according to claim 30, wherein said passivation layer further comprises silicon oxide.

* * * * *